United States Patent
Park et al.

(10) Patent No.: US 10,431,771 B2
(45) Date of Patent: Oct. 1, 2019

(54) ORGANIC LIGHT-EMITTING DISPLAY DEVICE

(71) Applicant: LG Display Co., Ltd., Seoul (KR)

(72) Inventors: JongChan Park, Paju-si (KR); Jee Hwan Oh, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/805,004

(22) Filed: Nov. 6, 2017

(65) Prior Publication Data
US 2018/0138450 A1    May 17, 2018

(30) Foreign Application Priority Data
Nov. 15, 2016  (KR) .......................... 10-2016-0152279

(51) Int. Cl.
*H01L 51/52* (2006.01)
*H01L 27/32* (2006.01)
*H01L 51/00* (2006.01)

(52) U.S. Cl.
CPC ........ *H01L 51/5253* (2013.01); *H01L 27/323* (2013.01); *H01L 27/3211* (2013.01); *H01L 27/3246* (2013.01); *H01L 27/3258* (2013.01); *H01L 51/5206* (2013.01); *H01L 51/5234* (2013.01); *H01L 51/5256* (2013.01); *H01L 51/0097* (2013.01); *H01L 2251/5315* (2013.01); *H01L 2251/5338* (2013.01)

(58) Field of Classification Search
CPC . H04J 1/00; H01L 27/32; H01L 51/52; H01L 27/323; H01L 27/3211; H01L 27/3246; H01L 27/3258; H01L 51/5206; H01L 51/5234; H01L 51/5256; H01L 51/5253

USPC .......................................................... 257/40
See application file for complete search history.

(56) References Cited

U.S. PATENT DOCUMENTS

| | | | |
|---|---|---|---|
| 2015/0372253 A1* | 12/2015 | Hong | .................... H01L 51/524 257/40 |
| 2016/0043346 A1 | 2/2016 | Kamiya et al. | |
| 2016/0204373 A1* | 7/2016 | Park | .................... H01L 27/3244 257/40 |
| 2016/0260928 A1* | 9/2016 | Choi | .................... H01L 51/5253 |
| 2016/0268540 A1 | 9/2016 | Kim et al. | |

(Continued)

FOREIGN PATENT DOCUMENTS

EP    2 960 962 A1    12/2015

*Primary Examiner* — Fazli Erdem
(74) *Attorney, Agent, or Firm* — Seed IP Law Group LLP

(57) ABSTRACT

Disclosed herein is an organic light-emitting display (OLED) device that includes: a substrate having an active area and an inactive area surrounding the active area; a first planarization layer flattening a surface on circuit elements in the active area and inactive area; an organic light-emitting element on the first planarization layer; an encapsulation element on the organic light-emitting element and the first planarization layer, the encapsulation element having a first inorganic layer, a second inorganic layer and an organic layer between the first and second inorganic layers; and a structure in the inactive area and spaced apart from the first planarization layer. The structure includes a first layer made of a same material as the first planarization layer; a plurality of walls on the first layer and spaced apart from each other; and a second layer that fills a space between the plurality of walls.

19 Claims, 11 Drawing Sheets

(56) References Cited

U.S. PATENT DOCUMENTS

| | | | | |
|---|---|---|---|---|
| 2016/0307971 A1* | 10/2016 | Jeon | .................... | H01L 27/3258 |
| 2016/0365398 A1* | 12/2016 | Kim | .................... | H01L 27/3258 |
| 2017/0033312 A1* | 2/2017 | Kim | .................... | H01L 51/5253 |
| 2017/0287995 A1* | 10/2017 | Kim | .................... | H01L 27/3258 |
| 2017/0331058 A1* | 11/2017 | Seo | ...................... | G02B 5/3016 |
| 2018/0151838 A1* | 5/2018 | Park | ...................... | G06F 3/0412 |

\* cited by examiner

ORGANIC LIGHT-EMITTING DISPLAY DEVICE

CROSS-REFERENCE TO RELATED APPLICATIONS

This application claims the priority of Korean Patent Application No. 10-2016-0152279 filed on Nov. 15, 2016, in the Korean Intellectual Property Office, the disclosure of which is incorporated herein by reference.

BACKGROUND

Technical Field

The present disclosure relates to an organic light-emitting display (OLED) device, and more specifically to an OLED device having an additional space with an even surface for disposing lines in an inactive area.

Description of the Related Art

The display device industry has been rapidly evolving. Various display devices which are thinner, lighter and consume less power have been developed.

Examples of such display devices include a liquid-crystal display (LCD) device, an organic light-emitting display (OLED) device, an electrophoretic display (EPD) device, plasma display (PDP) device, and electro-wetting display (EWD) device. Among these, an OLED device emerges as the next generation display device having a self-emitting characteristic since it exhibits good performance over LCD devices in terms of viewing angle, contrast ratio, response time, power consumption, etc.

Recently, as OLED devices have smaller size and higher resolution, the number of required signal lines is increased. However, the space or footprint for arranging them is insufficient. In such a situation, it is an important issue to secure a sufficient space for arranging various signal lines and other elements.

BRIEF SUMMARY

The inventors of the present disclosure have studied a scheme for disposing touch sensing electrodes for sensing a user's touch input in an OLED device, and have implemented a touch sensing unit in the OLED device by disposing such touch sensing electrodes on an encapsulation element. When the touch sensing electrodes are disposed on the encapsulation element, touch lines or wires for transmitting/receiving signals to/from the touch sensing electrodes can be disposed in the inactive area. However, there are abrupt level differences (i.e., surface irregularities) created by various components disposed therein. Therefore, in the inactive area, the touch lines formed on the encapsulation element may not be normally formed or may be disconnected. To overcome the above-described problems, the inventors of the present disclosure have devised an OLED device having a novel structure.

In view of the above, an aspect of the present disclosure is to provide an OLED device including an area with an even surface on the encapsulation element in the inactive area to allow a conductive layer to be disposed in the area so that the conductive layer can be utilized as a variety of lines.

Another aspect of the present disclosure is to provide an OLED device capable of avoiding additional processes or cost by forming a structure disposed in the inactive area for providing an even surface on the encapsulation element together with components disposed in the active area.

According to an embodiment of the present disclosure, an OLED device includes: a substrate comprising an active area and an inactive area surrounding the active area; a first planarization layer providing an even surface on circuit elements in the active area and the inactive area; an organic light-emitting element on the first planarization layer; an encapsulation element disposed on the organic light-emitting element and the first planarization layer and comprising a first inorganic layer, a second inorganic layer and an organic layer between the first and second inorganic layers; and a structure disposed in the inactive area and spaced apart from the first planarization layer. The structure includes a first layer made of a same material as the first planarization layer; a plurality of walls disposed on the first layer and spaced apart from each other; and a second layer for filling a space between the plurality of walls.

According to another embodiment of the present disclosure, an OLED device includes: a substrate on which an active area and an inactive area surrounding the active area are defined; at least one planarization layer disposed in the active area; an organic light-emitting element disposed on the at least one planarization layer; an encapsulation element covering the organic light-emitting element and comprising an organic layer; and a structure configured to suppress overflow of the organic layer and provide an even top surface.

Particulars of the example embodiments of the present disclosure will be described in the detail description with reference to the accompanying drawings.

According to an embodiment of the present disclosure, an area with an even surface for additionally disposing lines can be provided in an inactive area of an OLED device.

In addition, according to an embodiment of the present disclosure, an area with an even surface is provided in an inactive area of an OLED device by a structure, such that a touch line connected to touch sensing electrodes can be disposed in the area, thereby improving fabricating reliability of the touch line.

In addition, according to an embodiment of the present disclosure, a structure disposed in the inactive area for providing an even surface is formed together with the components disposed in the active area, such that the structure can be formed without any additional process or cost.

It should be noted that effects of the present disclosure are not limited to those described above and other effects of the present disclosure will be apparent to those skilled in the art from the following descriptions.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
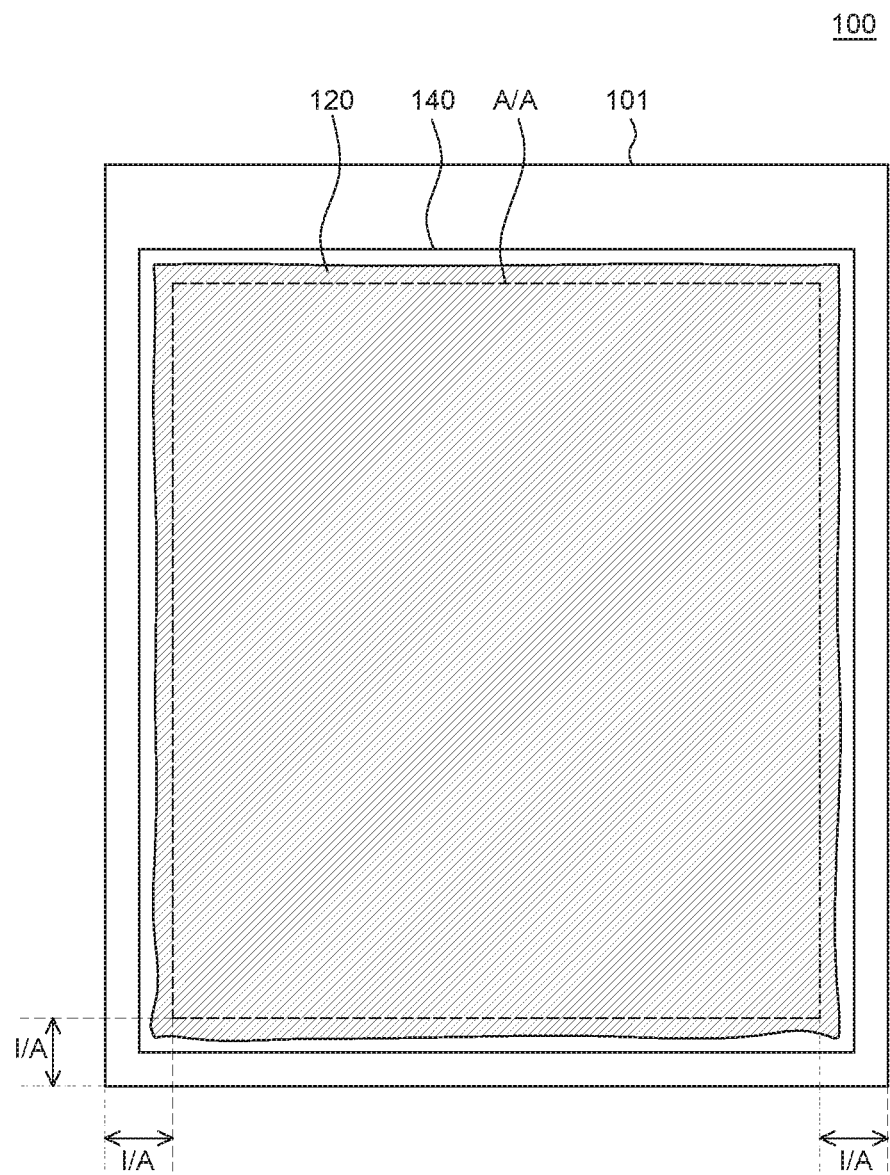
FIG. 1 is a schematic plan view for illustrating an organic light-emitting display (OLED) device according to an example embodiment of the present disclosure.

Advantages and characteristics of the present disclosure and methods to achieve them will become apparent from the descriptions of the embodiments hereinbelow with reference to the accompanying drawings. However, the present disclosure is not limited to example embodiments disclosed herein but may be implemented in various different ways. The example embodiments are provided for making the disclosure of the present technical features thorough and for fully conveying various features to those skilled in the art in order to practice the disclosure. It is to be noted that the scope of the present disclosure can be defined by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g., "a," "an," and "the," this includes a plural of that noun unless specifically stated otherwise.

For elements having specific values, they are interpreted as including error margins even without explicit statements.

In describing positional relationship, such as "an element A on an element B," "an element A above an element B," "an element A below an element B," and "an element A next to an element B," another element C may be disposed between the elements A and B unless the term "directly" or "immediately" is explicitly used.

As used herein, a phrase "an element A on an element B" refers to that the element A may be disposed directly on the element B and/or the element A may be disposed indirectly on the element B via another element C.

The terms first, second, and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

Like reference numerals denote like elements throughout the descriptions.

The drawings are not to scale and the relative dimensions of various elements in the drawings are depicted schematically and not necessarily to scale.

Features of various embodiments of the present disclosure may be combined partially or totally. As will be clearly appreciated by those skilled in the art, technically various interactions and operations are possible. Various example embodiments can be practiced individually or in combination.

Hereinafter, embodiments of the present disclosure will be described in detail with reference to the accompanying drawings.

FIG. 1 is a schematic plan view for illustrating an organic light-emitting display (OLED) device according to an embodiment of the present disclosure. FIG. 1 shows only a substrate 101, an encapsulation element 120 and a barrier film 140 among various elements of the OLED device 100 for convenience of illustration. The other elements of the OLED device 100 will be described below with reference to FIGS. 2 and 3.

As shown in FIG. 1, the OLED device 100 includes an active area A/A, in which an array of pixels is disposed. Although FIG. 1 shows only one active area A/A, more than one active area may be formed.

Referring to FIG. 1, an inactive area I/A may be disposed around the active area A/A. Specifically, the inactive area I/A may surround the active area A/A. Although the inactive area I/A is shown as surrounding the rectangular active area A/A in FIG. 1, the shape and arrangement of the active area A/A and the inactive area I/A are not limited to those shown in FIG. 1.

The active area A/A and the inactive area I/A may have shapes that go along with the design of an electronic device including the OLED device 100. For example, the active area A/A may have various shapes that are polygonal (i.e., with straight edges) or circular (i.e., with curved edges), and the inactive area I/A may have a shape that is adjacent to or surrounding at least some part or all of the active area A/A.

Each pixel in the active area A/A may be associated with a pixel driving circuit. The pixel driving circuit may include at least one switching transistor and at least one driving transistor. Each pixel driving circuit may be electrically connected to signal lines such as a gate line and a data line so as to communicate with a gate driver, a data driver, etc., disposed in the inactive area I/A.

The gate driver may be implemented with at least one thin-film transistor in the inactive area I/A. The driver may be referred to as GIPs (gate-in-panel) due to its structure and arrangement. The data driver may also be implemented in the inactive area I/A. In addition, some components such as a data IC (integrated circuit) may be mounted on a separated PCB and may be coupled with a connection interface (a pad, a bump, a pin, etc.) disposed in the inactive area I/A via a circuit film such as a flexible printed circuit board (FPCB), a chip-on-film (COF), a tape-carrier-package (TCP), etc. The PCB may be, but is not limited to, disposed on the rear surface of the substrate 101.

The OLED device 100 may include a variety of additional elements for generating various signals or for driving pixels in the active area A/A. The additional elements for driving the pixels may include an inverter circuit, a multiplexer, an electrostatic discharge (ESD) circuit, etc. The OLED device 100 may include additional elements associated with additional functionality other than driving the pixels. For example, the OLED device 100 may include additional elements for providing a touch sensing feature, a user authentication feature (e.g., fingerprint scanning feature), a multi-level pressure sensing feature, a tactile feedback feature, etc.

The substrate 101 supports thereon a variety of elements of the OLED device 100. The substrate 101 may be made of a transparent, insulative material such as glass, plastic, etc. On the substrate 101, the above-described active area A/A and inactive area I/A may be defined.

An organic light-emitting element 130 may be disposed on the substrate 101 in the active area A/A, and the encapsulation element 120 may be disposed on the organic light-emitting element 130 to cover it. The encapsulation element 120 protects the organic light-emitting element 130 from moisture or oxygen. The barrier film 140 is disposed on the encapsulation element 120. The organic light-emitting element 130, the encapsulation element 120 and the barrier film 140 will be described in detail below with reference to FIGS. 2 and 3.

The OLED device 100 may include a plurality of pixels, and each pixel may include a plurality of sub-pixels. The sub-pixel is a minimum unit for representing one color. One sub-pixel may include a plurality of transistors, a capacitor, and a plurality of lines. One sub-pixel may be made up of two transistors and one capacitor, which can be referred to as 2T1C, but this is not limiting. The sub-pixel may be of 4T1C, 7T1C or 6T2C type, for example. In this regard, the T denotes the number of transistors disposed in one sub-pixel, and the C denotes the number of capacitors disposed in one sub-pixel.

Figure 2:
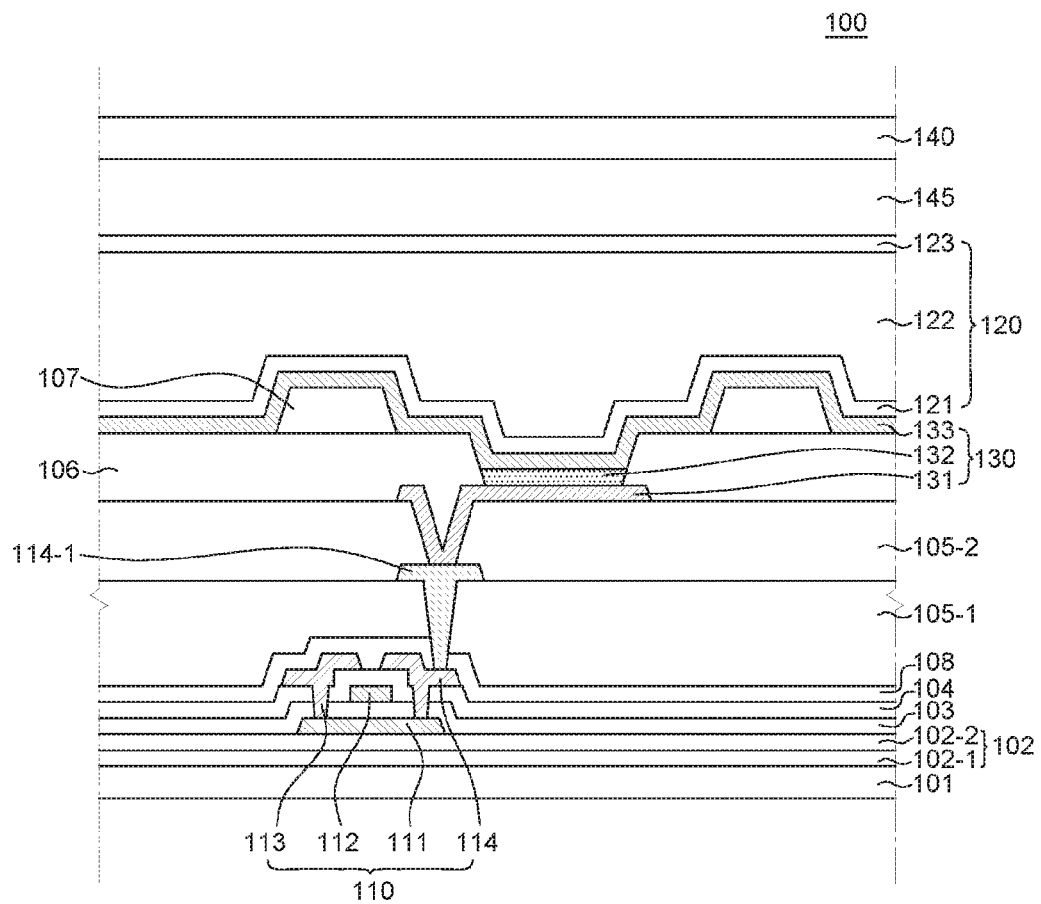
FIG. 2 is a cross-sectional view of a part of an active area of an OLED device according to an example embodiment of the present disclosure.

FIG. 2 is a cross-sectional view of a part of an active area of an OLED device according to an example embodiment of the present disclosure. FIG. 2 is a schematic cross-sectional view of a region corresponding to one pixel in the active area A/A of the OLED device 100.

The substrate 101 supports thereon a variety of elements of the OLED device 100. The substrate 101 may be made of a transparent, insulative material such as glass and plastic. When the substrate 101 is made of plastic, materials such as polyimide (PI)-based or polycarbonate (PC)-based materials may be used. Particularly, polyimide (PI) is commonly used since it can be applied to a high-temperature process and a coating process.

A buffer layer 102 may be disposed on the substrate 101. The buffer layer 102 protects electrodes and electric lines from impurities such as alkali ions that leak out of the substrate 101 or other layers. The buffer layer 102 may be made of silicon oxide (SiOx), silicon nitride ($SiN_x$), or multiple layers thereof.

As shown in FIG. 2, the buffer layer 102 includes a multi-buffer 102-1 and an active buffer 102-2. The multi-buffer 102-1 may be formed by alternately stacking silicon oxide ($SiO_2$) and silicon nitride ($SiN_x$), and may suppress the diffusion of moisture and/or oxygen permeating into the substrate 101. The active buffer 102-2 protects the active layer 111 of a thin-film transistor 110 and can suppress various kinds of defects. The active buffer 102-2 may be formed of amorphous silicon (a-Si), etc. Although the buffer layer 102 is shown as including both of the multi-buffer 102-1 and the active buffer 102-2 in FIG. 2, it is merely illustrative. The buffer layer 102 may include only one of them. Also, the buffer layer 102 may be eliminated depending on design specifications.

The thin-film transistor 110 includes an activate layer 111, a gate electrode 112, a source electrode 113, and a drain electrode 114. Referring to FIG. 2, the active layer 111 is disposed on the buffer layer 102, in which the channel of the thin-film transistor 110 is to be formed. The active layer 111 may be formed of various materials such as polysilicon, amorphous silicon and oxide semiconductor. A gate insulating layer 103 is disposed on the active layer 111. The gate insulating layer 103 is disposed so as to insulate the active layer 111 from the gate electrode 112. The gate insulating layer 103 may be made of an inorganic material such as silicon oxide and silicon nitride, and may be made up of a single layer or multiple layers. The gate electrode 112 is disposed on the gate insulating layer 103. An interlayer insulating layer 104 is disposed on the gate electrode 112.

The interlayer insulating film 104 may be made of an inorganic material such as silicon oxide and silicon nitride, and may be made up of a single layer or multiple layers. The source electrode 113 and the drain electrode 114 are disposed on the interlayer insulating layer 104. Each of the source electrode 113 and the drain electrode 114 is electrically connected to the active layer 111 via a contact hole formed in the interlayer insulating layer 104 and in the gate insulating layer 103. Although the thin-film transistor 110 is shown as a co-planar structure in FIG. 2 for convenience of illustration, this is merely illustrative.

A passivation layer 108 for protecting the source electrode 113 and the drain electrode 114 is disposed on the source electrode 113 and the drain electrode 114. The passivation layer 108 is made of an inorganic material such as silicon oxide and silicon nitride, and may be made up of a single layer or multiple layers. It is to be noted that the passivation layer 108 is not an essential element and thus may be eliminated depending on the design of the OLED device 100.

Although FIG. 2 shows only the driving thin-film transistor 110 among various devices for driving the organic light-emitting element 130 for convenience of illustration, this is merely illustrative. That is, various elements such as a switching thin-film transistor for driving the organic light-emitting element 130, a thin-film transistor for compensation and a capacitor may be disposed in the active area A/A, which may configure circuit elements 112' and 114'.

A first planarization layer 105-1 can be disposed on the thin-film transistor 110. The first planarization layer 105-1 is an insulating layer for providing a flat surface on the circuit elements 112' and 114' including the thin-film transistor 110 and protecting the thin-film transistor 110. The first planarization layer 105-1 may be formed of, but is not limited to, at least one among an acrylic-based resin, an epoxy resin, a phenol resin, a polyamide-based resin, a polyimide-based resin, an unsaturated polyester resin, a polyphenylene-based resin, polyphenylene sulfide-based resin, etc.

On the first planarization layer 105-1, various metal layers that function as conductive lines or electrodes may be disposed. For example, as shown in FIG. 2, a connection electrode 114-1 for electrically connecting the thin-film transistor 110 (via a contact hole) with an anode 131 may be disposed on the first planarization layer 105-1.

A second planarization layer 105-2 can be disposed on the first planarization layer 105-1. The second planarization layer 105-2 provides a flat surface on the first planarization layer 105-1. The second planarization layer 105-2 may be formed of, but is not limited to, at least one among an acrylic-based resin, an epoxy resin, a phenol resin, a polyamide-based resin, a polyimide-based resin, an unsaturated polyester resin, a polyphenylene-based resin, polyphenylene sulfide-based resin, etc.

According to an example embodiment of the present disclosure, the OLED device 100 includes the two planarization layers 105-1 and 105-2 because the numbers of various lines and elements increase as the resolution of the OLED device 100 becomes higher. That is, in a high-resolution OLED device, a larger number of lines and elements have to be disposed in a narrower space, and thus a space for disposing lines and elements can be increased using the two planarization layers 105-1 and 105-2. Accordingly, by disposing various metal layers such as the connection electrode 114-1 between the first planarization layer 105-1 and the second planarization layer 105-2, it is possible to make the design of lines, electrodes and elements easier. Also, when a dielectric material is used for the first planarization layer 105-1 and the second planarization layer 105-2, the first planarization layer 105-1 and/or the second planarization layer 105-2 may be used for forming the capacitance of a capacitor between metal layers.

The organic light-emitting element 130 may be disposed on the first and second planarization layers 105-1 and 105-2. The organic light-emitting element 130 includes an anode 131, an organic emission layer 132 on the anode 131, and a cathode 133 on the organic emission layer 132. The anode 131 may be electrically connected to the drain electrode 114 of the thin-film transistor 110 via the connection electrode 114-1. When the OLED device 100 is a top-emission OLED device, the anode 131 may be formed of a reflective layer having high reflectance and a transparent conductive layer on the reflective layer, for example. In addition, when the OLED device 100 is a top-emission OLED device, the cathode 133 may be formed of a transparent conductive layer and may be formed of a very thin metal material, for example. The organic emission layer 132 may be made up of a single emission layer emitting light of a specific color (i.e., red, green or blue) or may be made up of a plurality of emission layers to emit white light. In addition to the organic emission layer 132, an electron injection layer, an electron transport layer, a hole transport layer, a hole injection layer, etc., may be further disposed. These layers may be distinct or some of their functionalities may be combined into the same layer. Further, as shown in FIG. 2, the organic emission layer 132 may be formed in each of the pixels or may be formed as a single, continuous piece extended across or throughout the entire active area A/A. When the organic emission layer 132 of the organic light-emitting element 130 emits white light, a color filter or color refiner may be formed on or under the organic light-emitting element 130.

A bank 106 (or bank structure) may be disposed on the second planarization layer 105-2 in the other area of the active area A/A than the emission area. That is, the bank 106 may cover only a part of the anode 131 so as to expose the other part of the anode 131, such that the exposed part of the anode 131 may be defined as the emission area. The bank 106 may be made of an inorganic insulative material such as silicon oxide and silicon nitride, or an organic insulative material such as BCB, acryl-based resin and imide-based resin.

A spacer 107 may be disposed on the bank 106. The spacer 107 serves to avoid damage to the organic light-emitting element 130, which may occur if a fine metal mask (FMM) used in a manufacturing process of forming the organic emission layer 132 of the organic light-emitting element 130 comes directly in contact with the bank 106 or the anode 131. The spacer 107 may be made of either the same material as or a different material from that of the bank 106. Further, the spacer 107 and the bank 106 may be formed together during the same process. The cathode 133 may be disposed to cover the spacer 107 and the bank 106 as the spacer 107 is disposed on the bank 106.

The encapsulation element 120 is disposed on the first and second planarization layers 105-1 and 105-2 and the organic light-emitting element 130. The encapsulation element 120 reduces oxygen and moisture permeating into the organic light-emitting element 130 and various electrodes and lines. For example, if the organic light-emitting element 130 is exposed to moisture or oxygen, the emission area may shrink, i.e., pixel shrinkage may occur, or black spots may be created in the emission area. To overcome such problems, the encapsulation element 120 may be disposed on the organic light-emitting element 130.

The encapsulation element 120 may include a first inorganic layer 121, an organic layer 122 on the first inorganic layer 121, and a second inorganic layer 123 on the organic layer 122. That is, the organic layer 122 is disposed between the first inorganic layer 121 and the second inorganic layer 123. The organic layer 122 may be surrounded by the first inorganic layer 121 and the second inorganic layer 123. The first inorganic layer 121 and the second inorganic layer 123 serve to suppress the permeation of moisture or oxygen. The organic layer 122 can cover foreign matter or debris (i.e., generated or introduced during manufacturing) to provide the flat surface of the second inorganic layer 123. As described above, by configuring the encapsulation element 120 with the plurality of inorganic layers 121 and 123 and the organic layer 122, paths via which moisture or oxygen may pass become longer and more complicated, such that it is possible to suppress or delay as late as possible the permeation of moisture or oxygen.

The first inorganic layer 121 is made of an inorganic material. For example, the first inorganic layer 121 may be made of an inorganic material such as one of silicon oxide ($SiO_2$), silicon nitride (SiNx) and aluminum oxide (AlOz). The first inorganic layer 121 may be formed by, but is not limited to, a vacuum deposition method such as chemical vapor deposition (CVD) or atomic layer deposition (ALD).

The organic layer 122 may cover foreign matters or particles that may be created during the fabricating process. The organic layer 122 may be made of an organic material, for example, silicon oxycarbon (SiOCz) acryl or epoxy-based resin. The organic layer 122 may be formed by various coating methods such as inkjet coating and slit coating.

The second inorganic layer 123 is made of an inorganic material. For example, the second inorganic layer 123 may be made of an inorganic material such as one of silicon oxide, silicon nitride and aluminum oxide. The second inorganic layer 123 may be formed by, but is not limited to, a vacuum deposition method such as chemical vapor deposition or atomic layer deposition.

The barrier film 140 may be disposed on the encapsulation element 120. The barrier film 140 encapsulates the elements thereunder including the organic light-emitting element 130. The barrier film 160 may be a retarded film or an optically isotropic film, for example. If the barrier film 140 has optically isotropic property, it transmits the light incident thereon without phase retardation. In addition, an organic layer or an inorganic layer may be further disposed on or under the barrier film 140. The organic layer or the inorganic layer formed on or under the barrier film 140 serves to prevent permeation of moisture or oxygen. An adhesive layer 145 is disposed between the barrier film 140 and the encapsulation element 120. The adhesive layer 145 attaches the encapsulation element 120 to the barrier film 140. The adhesive layer 145 may be a heat-curable, light-curable or naturally-curable adhesive. For example, the adhesive layer 145 may be made of a material such as B-PSA (Barrier pressure sensitive adhesive).

A polarizing film, a top cover, etc., may be further disposed on the barrier film 140. In some example embodiments, the barrier film 140 and the adhesive layer 145 may be eliminated depending on the design of the OLED device 100.

Figure 3:
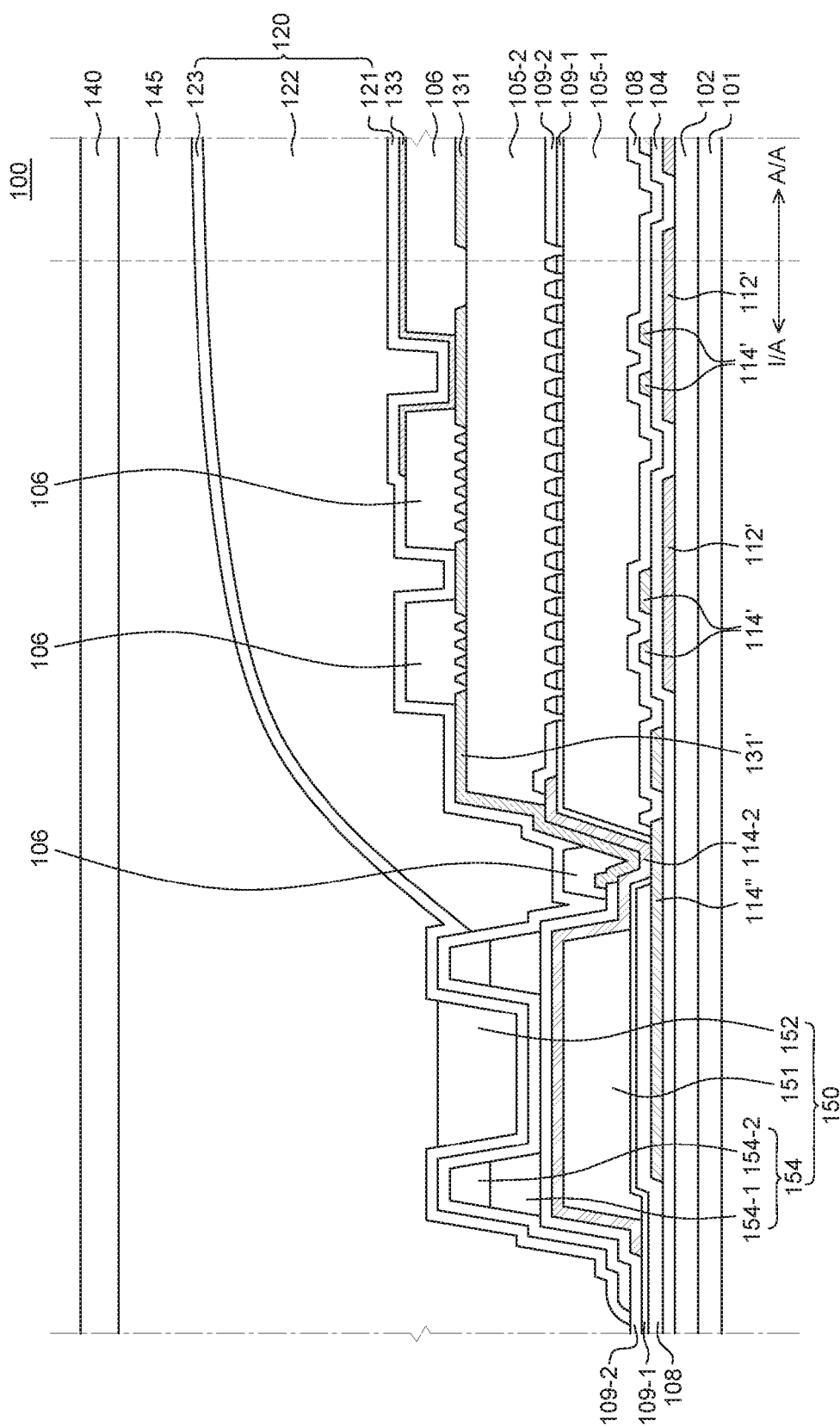
FIG. 3 is a cross-sectional view of a part of an active area and an inactive area of an OLED device according to an example embodiment of the present disclosure.

FIG. 3 is a cross-sectional view of a part of an active area and an inactive area of an OLED device according to an embodiment of the present disclosure. FIG. 3 shows a part of the active area A/A and the inactive area I/A of the OLED device 100. The identical elements described above with reference to FIG. 2 will not be described.

In the inactive area I/A, the circuit elements 112' and 114' are disposed on the substrate 101. The circuit elements 112' and 114' may be made of the same material as the conductive material for the thin-film transistor 110 formed in the active area A/A. For example, the circuit elements 112' and 114' may be made of the same material as the gate electrode 112, the source electrode 113 and the drain electrode 114 of the thin-film transistor 110 via the same process. The circuit elements 112' and 114' may include, for example, a GIP (Gate-In-Panel) and various lines.

In the inactive area I/A, a variety of insulating layers are formed above the circuit elements 112' and 114'. For example, as shown in FIG. 3, the first planarization layer 105-1 and the second planarization layer 105-2 may be extended continuously from the active area A/A.

On the first planarization layer 105-1, metal layers having various functions may be disposed, such as the connection electrode 114-1 as shown in FIG. 2 or a second connection line 114-2 as shown in FIG. 3. Inorganic material layers 109-1 and 109-2 for disposing and protecting such metal layers may be disposed on the first planarization layer 105-1. For example, the inorganic material layers 109-1 and 109-2 may be buffer layers and protective layers made of an inorganic material. The inorganic material layers 109-1 and 109-2 may include an opening(s) for out-gassing any gas generated in the first planarization layer 105-1. In some embodiments, the inorganic material layers 109-1 and 109-2 may be eliminated depending on the design of the OLED device 100.

In the inactive area I/A, a power line 114" is disposed on a further outer side than the circuit elements 112' and 114'. The power line 114" may be, for example, a ground voltage line Vss. Although the power line 114" is shown as being made of the same material as the source electrode 113 and the drain electrode 114 in FIG. 3, this is merely illustrative. It may be made of the same material as the gate electrode 112. The first planarization layer 105-1 is disposed above the circuit elements 112' and 114' to provide a flat surface on the circuit elements 112' and 114'.

When the power line 114" is the ground voltage line Vss, the power line 114" is electrically connected to the cathode 133 in the inactive area I/A. Specifically, as shown in FIG. 3, the cathode 133 may be in contact with a first connection line 131' made of the same material as the anode 131 via the same process, the first connection line 131' may be in contact with the second connection line 114-2 made of the same material as the connection electrode 114-1 via the same process, and the second connection line 114-2 may be in contact with the power line 114", such that the power line 114" may be electrically connected to the cathode 133. The first connection line 131' may include an opening for out-gassing gas generated in the first planarization layer 105-1 and the second planarization layer 105-2.

A structure 150 (e.g., a plurality of dams) is disposed in the inactive area I/A, apart from the first planarization layer 105-1 and the second planarization layer 105-2. The structure 150 can suppress the organic layer 122 of the encapsulation element 120 from overflowing. That is, as shown in FIG. 3, the structure 150 can prevent the organic layer 122 of the encapsulation element 120 is excessively applied during the manufacturing process. In addition, the structure 150 may provide an even top surface. As used herein, the term "the even surface" means a completely flat surface or a substantially flat surface having a certain degree of flatness such that a conductive layer can be formed normally thereon without being disconnected despite some level differences.

Referring to FIG. 3, the structure 150 includes a first layer 151, a plurality of walls 154 on the first layer 151, and a second layer 152 filling a space between the plurality of walls 154.

The first layer 151 is made of the same material as the first planarization layer 105-1. That is, the first layer 151 may be formed of the same material as the first planarization layer 105-1 via the same process. As the first layer 151 is made of the same material as the first planarization layer 105-1 via the same process, the first layer 151 may works as a subsidiary layer that increases the height of the structure 150. Although the first planarization layer 105-1 is shown as being disposed on the power line 114", the passivation layer 108 and the inorganic layers 109-1 and 109-2 in FIG. 3, at least some of the power line 114", the passivation layer 108 and the inorganic layers 109-1 and 109-2 may not be disposed under the first planarization layer 105-1 depending on the design of the OLED device 100. Although the first layer 151 is formed of the same material as the first planarization layer 105-1 in the example shown in FIG. 3, the first layer 151 may be formed of the same material as the second planarization layer 105-2 in other implementations.

The plurality of walls 154 are spaced apart from each other on the first layer 151. For example, as shown in FIG. 3, one of the plurality of walls 154 may be disposed on the first layer 151 adjacent to the first planarization layer 105-1 and the second planarization layer 105-2 while the other one may be disposed on the first layer 151 adjacent to the outer side of the substrate 101. As will be described later, in order to obtain a sufficient space for forming the second layer 152, the plurality of walls 154 may be spaced apart from each other on the first layer 151 as far as possible. Although the two walls 154 are shown in FIG. 3, the number of the plurality of walls 154 is not limited to two.

The plurality of walls 154 may be made of the same material as one or more insulating patterns disposed in the active area A/A. For example, the plurality of walls 154 may include a lower layer 154-1 made of the same material as the bank 106, and an upper layer 154-2 made of the same material as the spacer 107. The lower layer 154-1 of the first walls 154 may be made of the same material as the bank 106 via the same process, and the upper layer 154-2 of the first walls 154 may be made of the same material as the spacer 107 via the same process. However, this is merely illustrative. For example, the lower layer 154-1 of the plurality of walls 154 may be made of the same material as the second planarization layer 105-2, and the upper layer 154-2 of the plurality of walls 154 may be made of the same material as the bank 106 or the spacer 107. In addition, the plurality of walls 154 may include a lower layer 154-1 made of the same material as the second planarization layer 105-2, an intermediate layer made of the same material as the bank 106, and an upper layer 154-2 made of the same material as the spacer 107.

The second layer 152 may be a filling layer disposed on the first planarization layer 105-1 to fill the space between the plurality of walls 154. As shown in FIG. 3, when the first inorganic layer 121 and the second inorganic layer 123 of the encapsulation element 120 are formed such that they cover the first planarization layer 105-1 and the plurality of walls 154 of the structure 150, the second layer 152 is disposed on the first inorganic layer 121 and the second inorganic layer 123 between the plurality of walls 154, to fill the space between the plurality of walls 154.

The second layer 152 may be made of a material that can make the top surface of the structure 150 even. For example, the second layer 152 may be made of an organic material and may be made of the same material as the organic layer 122 of the encapsulation element 120. When the second layer 152 is made of the same material as the organic layer 122 of the encapsulation element 120, the second layer 152 may be formed by inkjet coating.

In some embodiments, the second layer 152 may be formed such that the top surface of the second inorganic layer 123 disposed on the plurality of walls 154 is higher than the top surface of the second layer 152. As described above, when the second layer 152 is formed of an organic material, it may be formed by ink-jet coating. In this case, the organic material is applied to the space between the plurality of walls 154. In doing so, it is very difficult to accurately fill the space between the plurality of walls 154 with the organic material to achieve flat top surfaces of the second inorganic layer 123 and the second layer 152 disposed on the plurality of walls 154. That is to say, it may be possible to provide flat top surfaces of the second inorganic layer 123 and the second layer 152 disposed on the plurality of walls 154 by accurately adjusting the amount of the organic material to be coated in the space between the plurality of walls 154. However, there may be a processing margin, such that the organic material may overflow the space between the plurality of walls 154. When this happens, the organic material may flow along a side surface of the structure 150 or may permeate between the first inorganic layer 121 and the second inorganic layer 123 of the encapsulation element 120. The organic material permeating between the first inorganic layer 121 and the second inorganic layer 123 may provide a path via which moisture or oxygen may pass. Accordingly, it is desired to coat a less amount of the organic material taking into account the manufacturing processing margin. Accordingly, the top surface of the second inorganic layer 123 disposed on the plurality of walls 154 may be higher than the top surface of the second layer 152.

In the OLED device 100 according to the example embodiment of the present disclosure, the structure 150 is disposed in the inactive area I/A, such that the overflow of the organic layer 122 can be suppressed. That is, since the organic material is suppressed from being excessively applied to the outer side of the substrate 101 in the process of forming the organic layer 122, the structure 150 controls the flow of the organic material to define the area where the organic material is applied to form the organic layer 122.

In addition, in the OLED device 100 according to the example embodiment of the present disclosure, the structure 150 can provide an even top surface in the inactive area I/A. As OLED devices have smaller size and higher resolution recently, the number of required lines is increased. However, the space for disposing them is insufficient. Particularly, in the inactive area I/A, various components are disposed, such that there are many steep level differences. When a line is disposed along a steep level difference, the line may not be normally formed or may be disconnected. In the OLED device 100 according to the example embodiment of the present disclosure, an additional even area can be provided in the inactive area I/A using the structure 150, such that an additional space for disposing various lines can be provided. By doing so, it is possible to avoid disconnection of lines, and to reduce the size of the bezel since it is not necessary to increase the size of the inactive area I/A to provide the space for disposing lines.

In addition, in the OLED device 100 according to the example embodiment of the present disclosure, a process for fabricating the structure 150 can be simplified. Specifically, since the first layer 151 and the plurality of walls 154 of the structure 150 are made of the same material as an insulating pattern disposed in the active area A/A, the first layer 151 and the plurality of walls 154 can be formed when the insulating pattern is formed. In addition, the second layer 152 of the structure 150 may be formed of the same material as the organic layer 122 of the encapsulation element 120, and thus the second layer 152 can be formed by using the organic material used for fabricating the organic layer 122 of the encapsulation element 120 with the same manufacturing equipment. As a result, the overflow of the organic layer 122 of the encapsulation element 120 can be suppressed, the process of fabricating the structure 150 that provides the even surface can be simplified, and the fabricating cost can also be reduced.

Figure 4:
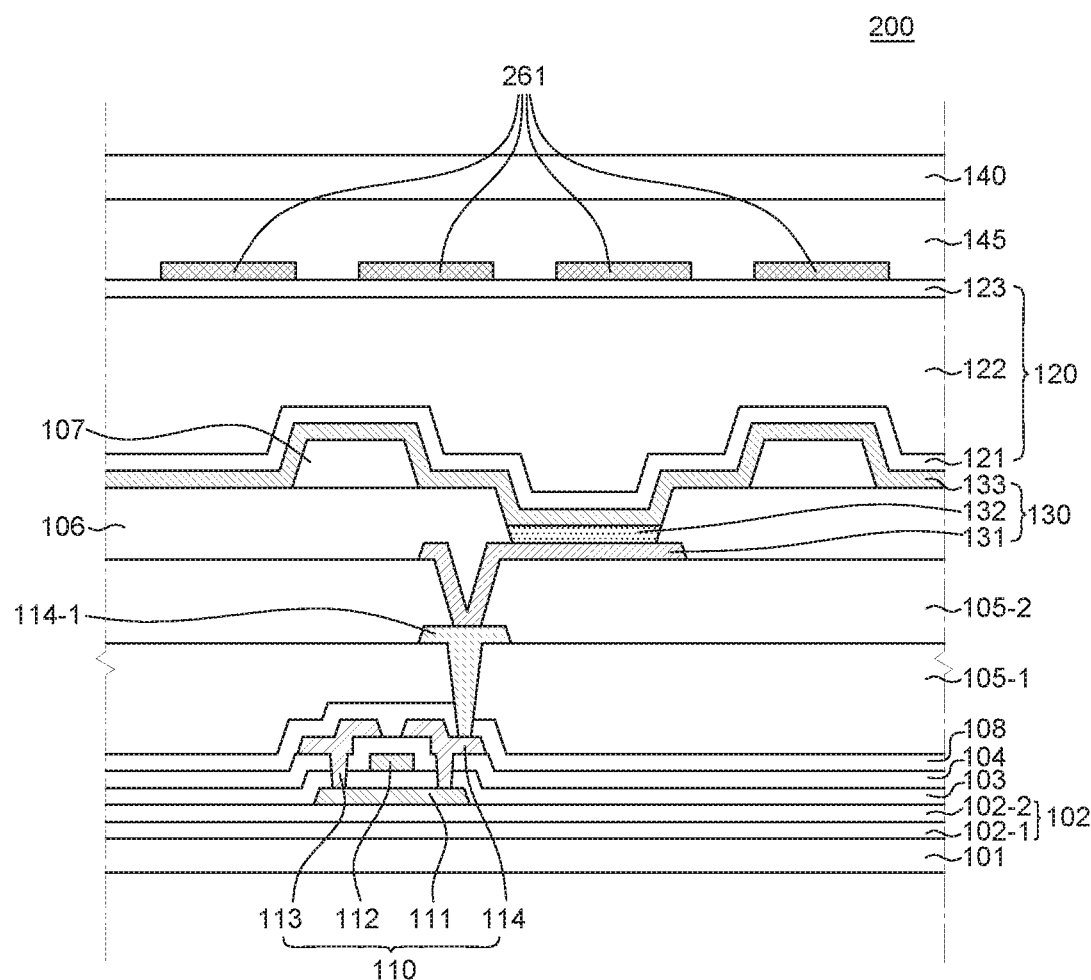
FIG. 4 is a cross-sectional view of a part of an active area of an OLED device according to another example embodiment of the present disclosure.
Figure 5:
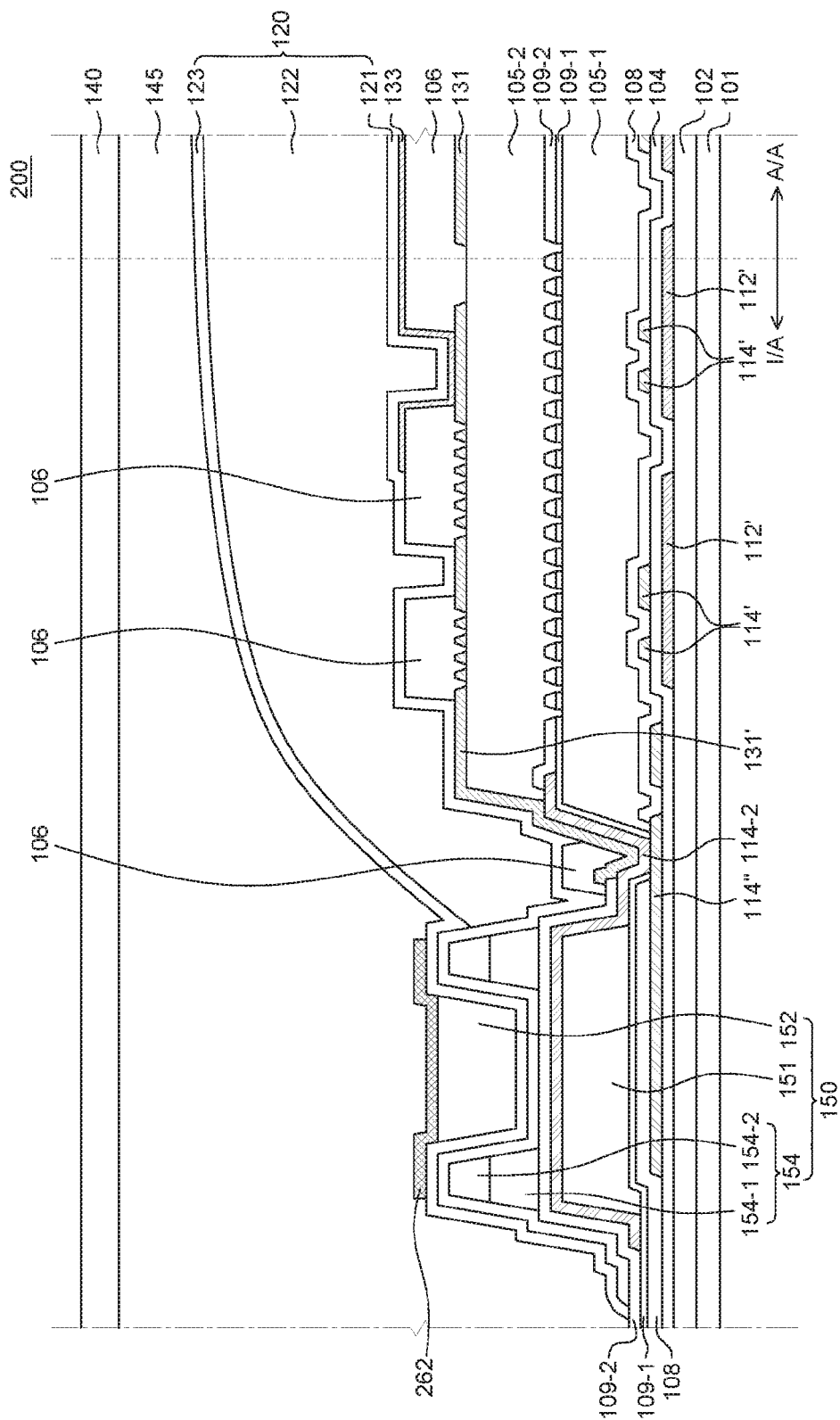
FIG. 5 is a cross-sectional view of a part of an active area and an inactive area of an OLED device according to another example embodiment of the present disclosure.

FIG. 4 is a cross-sectional view of a part of an active area of an OLED device according to another example embodiment of the present disclosure. FIG. 5 is a cross-sectional view of a part of an active area and an inactive area of an OLED device according to another example embodiment of the present disclosure. The OLED device 200 shown in FIGS. 4 and 5 is substantially identical to the OLED device 100 shown in FIGS. 1 to 3 except that a plurality of touch sensing electrodes 261 is disposed on the encapsulation element 120 and that a touch line 262 is disposed on the structure 150; and, therefore, the redundant description will be omitted.

Referring to FIG. 4, a plurality of conductive patterns may be disposed on the encapsulation element 120 in the active area A/A. The plurality of conductive patterns may be a plurality of touch sensing electrodes 261. That is, the plurality of touch sensing electrodes 261 is formed on the second inorganic material layer 123 of the encapsulation element 120. As shown in FIG. 4, the plurality of touch sensing electrodes 261 may be formed in the form of a plurality of blocks. In this case, the plurality of touch sensing electrodes 261 may be made of a transparent conductive material such as ITO. In some embodiments, the plurality of touch sensing electrodes 261 may be made as a metal mesh. That is, each of the plurality of touch sensing electrodes 261 may be made of a metal material, and they may be arranged in the form of a mesh on the plane.

Referring to FIG. 5, a conductive layer may be disposed on the structure 150 disposed in the inactive area I/A. The conductive layer may be the touch line 262. The touch line 262 may be electrically connected to the touch sensing electrodes 261 disposed in the active area A/A to transmit/receive a signal to/from the touch sensing electrodes 261.

In the OLED device 200 according to this example embodiment of the present disclosure, the touch sensing electrodes 261 can be formed directly on the encapsulation element 120 instead of attaching an additional touch panel. Therefore, the process of forming the touch sensing electrodes 261 can be simplified as compared with the method of fabricating and attaching an additional touch panel, and a light and thin OLED device can be produced.

In addition, in the OLED device 200 according to this example embodiment of the present disclosure, the structure 150 provides an even top surface. Accordingly, the conductive layer such as the touch line 262 can be formed on the structure 150 without being disconnected or damaged by a level difference in the inactive area I/A. As a result, the touch line 262 can be fabricated reliably, and a space for forming the touch line 262 can be created, such that the size of the inactive area I/A can be reduced.

Hereinafter, the effects of the OLED device 200 according to this example embodiment of the present disclosure will be described in more detail with reference to FIG. 6.

Figure 6:
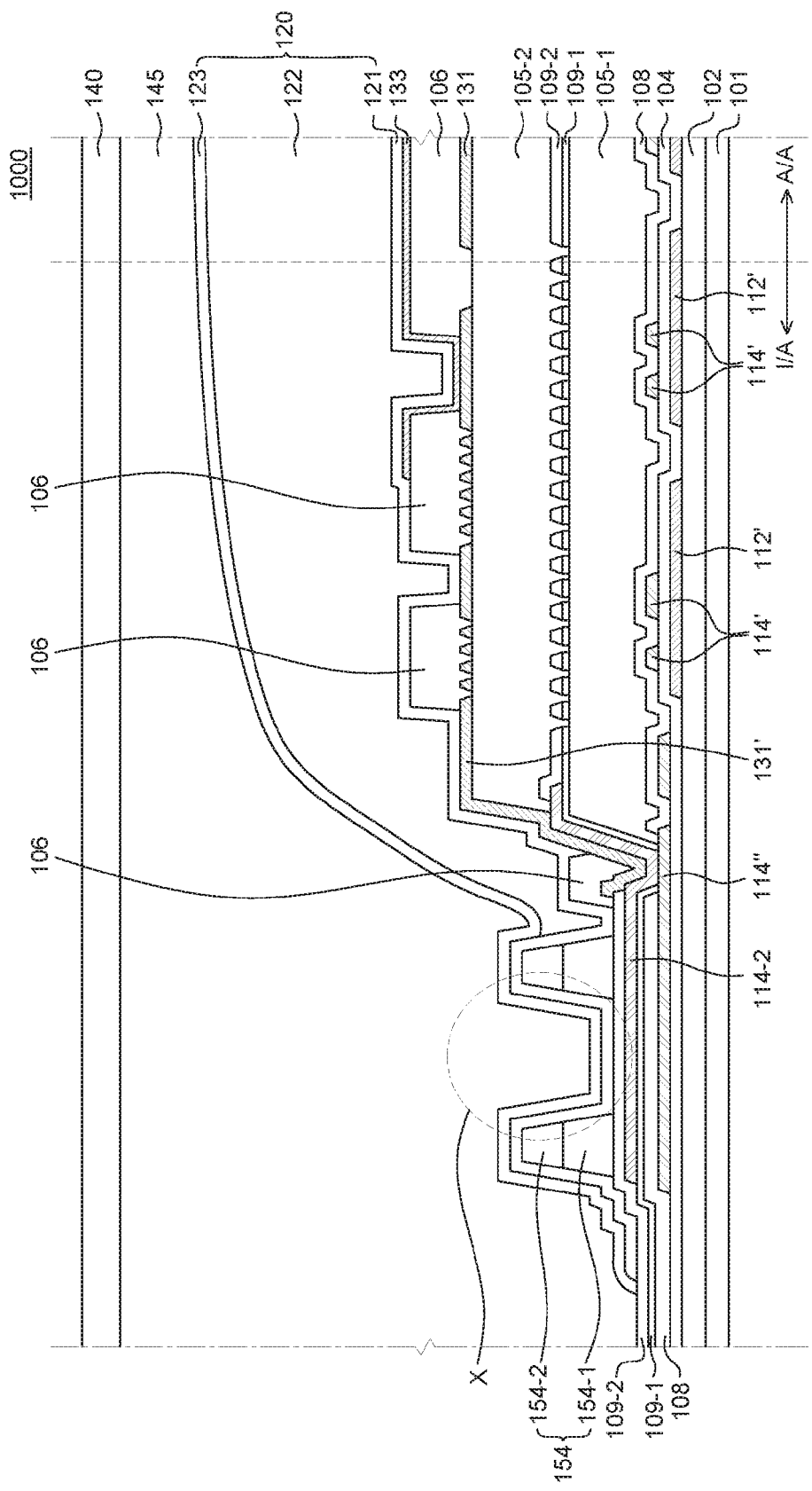
FIG. 6 is a cross-sectional view of a part of an active area and an inactive area of an OLED device according to a Comparative Example.

FIG. 6 is a cross-sectional view of a part of an active area and an inactive area of an OLED device according to the Comparative Example. The OLED device 1000 shown in FIG. 6 is substantially identical to the OLED device 100 shown in FIGS. 4 and 5 except that the first layer 151 and the second layer 152 of the structure 150 are eliminated; and, therefore, the redundant description will be omitted.

Referring to FIG. 6, in the OLED device 1000 according to the Comparative Example, only a plurality of walls 154 is disposed in the inactive area I/A. Therefore, in the OLED device 1000 according to the Comparative Example, the organic material is likely to overflow during the process of forming the organic layer 122 of the encapsulation element 120, compared to the OLED device 100 shown in FIGS. 4 and 5 that further includes the first layer 151 made of the same material as the first planarization layer 105-1 or the second planarization layer 105-2.

In addition, referring to FIG. 6, in the OLED device 1000 according to the Comparative Example, the second layer 152 is eliminated that is used to fill the space between the plurality of walls 154. Therefore, in the OLED device 1000 according to Comparative Example, there is region X where a large level difference is created by the plurality of walls 154. Accordingly, in the OLED device 1000 according to the Comparative Example, a conductive layer such as the touch line 262 formed on the plurality of walls 154 is likely to be disconnected or formed abnormally, compared to the OLED device 100 shown in FIGS. 4 and 5 that further includes the second layer 152 used to fill the space between the plurality of walls 154. To avoid this, in the OLED device 100 according to the Comparative Example, a conductive layer such as the touch line 262 may be disposed on the outer side of the plurality of walls 154. However, this results in an increase in the size of the inactive area I/A.

In contrast, the OLED devices 100 shown in FIGS. 4 and 5 can suppress the organic material from being excessively applied toward the outer side of the substrate 101 during the process of forming the organic material layer 122 of the encapsulation element 120, compared to the OLED device 1000 shown in FIG. 6. In addition, it can be seen that the OLED devices 100 shown in FIGS. 4 and 5 can provide an additional even area in the inactive area I/A to provide additional space for disposing various lines.

Figure 7:
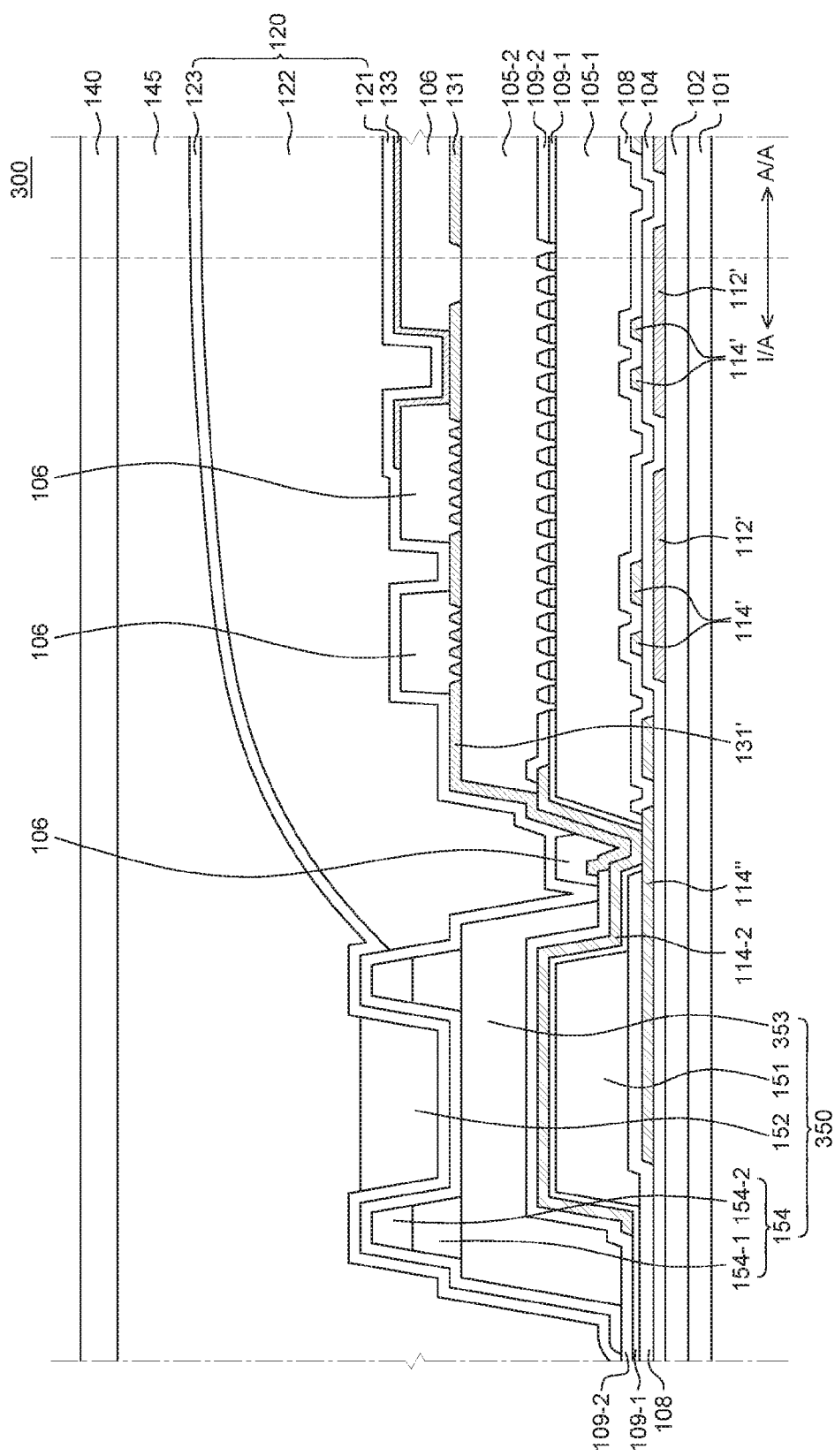
FIGS. 7 to 11 are cross-sectional views of a portion of an active area and an inactive area of OLED devices according to example embodiments of the present disclosure.

FIG. 7 is a cross-sectional view of a part of an active area and an inactive area of an OLED device according to yet another example embodiment of the present disclosure. The OLED device 300 shown in FIG. 7 is substantially identical to the OLED device 100 shown in FIGS. 1 to 3 except that a structure 350 further includes a third layer 353; and, therefore, the redundant description will be omitted.

Referring to FIG. 7, a structure 350 is disposed in the inactive area I/A, apart from the first planarization layer 105-1 and the second planarization layer 105-2. The structure 350 includes a first layer 151, a third layer 353 on the first layer 151, a plurality of walls 154 on the first layer 151 and the third layer 353, and a second layer 152 filling the space between the plurality of walls 154. That is, the structure 350 further includes the second layer 152 between the first layer 151 and the plurality of walls 154.

The first layer 151 is made of the same material as the first planarization layer 105-1, and the third layer 353 is made of the same material as the second planarization layer 105-2. That is, the first layer 151 is formed with the same material as the first planarization layer 105-1 via the same process, and the third layer 353 is formed with the same material as the second planarization layer 105-2 via the same process.

Referring to FIG. 7, the third layer 353 is disposed on the first layer 151 to cover the top and bottom surfaces of the first layer 151. Accordingly, the top surface of the third layer 353 may be wider than the top surface of the first layer 151.

The plurality of walls 154 are spaced apart from each other on the first layer 151. For example, as shown in FIG. 3, one of the plurality of walls 154 may be disposed on the third layer 353 adjacent to the first planarization layer 105-1 and the second planarization layer 105-2 while the other one may be disposed on the third layer 353 adjacent to the outer side of the substrate 101. The lower layer 154-1 of the first walls 154 may be made of the same material as the bank 106 via the same process, and the upper layer 154-2 of the first walls 154 may be made of the same material as the spacer 107 via the same process.

The second layer 152 may be disposed on the third layer 353 and may be used to fill the space between the plurality of walls 154. As shown in FIG. 7, when the first inorganic layer 121 and the second inorganic layer 123 of the encapsulation element 120 are formed such that they cover the first layer 151 and the third layer 353 and the plurality of walls 154 of the structure 350, the second layer 152 is disposed on the first inorganic layer 121 and the second inorganic layer 123 between the plurality of walls 154 to fill the space between the plurality of walls 154.

A touch line may be disposed on the structure 350 of the OLED device 300, and touch sensing electrodes may be disposed on the encapsulation element 120 in the active area A/A, as shown in FIGS. 4 and 5.

In the OLED device 300 according to this example embodiment, the structure 350 includes a first layer 151 made of the same material as the first planarization layer 105-1, and a third layer 353 disposed on the first layer 151 and made of the same material as the second planarization layer 105-2. The plurality of walls 154 of the structure 350 is disposed on the first layer 151 and the third layer 353. Consequently, the height of the structure 350 can be further increased, such that it is possible to suppress the organic material from overflowing during the process of forming the organic material layer 122 of the encapsulation element 120.

In addition, in the OLED device 300 according to this example embodiment of the present disclosure, the third layer 353 is disposed on the first layer 151 so as to cover the top and side surfaces of the first layer 151. Accordingly, the area of the top surface of the third layer 353 is larger than the area of the top surface of the first layer 151. Therefore, the spacing between the plurality of walls 154 is increased when the plurality of walls 154 are disposed on the third layer 353, compared to when the plurality of walls 154 are disposed on the first layer 151. Therefore, the space to be filled with the second layer 152 is further increased, so that the area of the even top surface of the structure 350 is increased. As a result, the area of the region where a conductive layer such as the touch line 262 may be disposed becomes larger.

Figure 8:
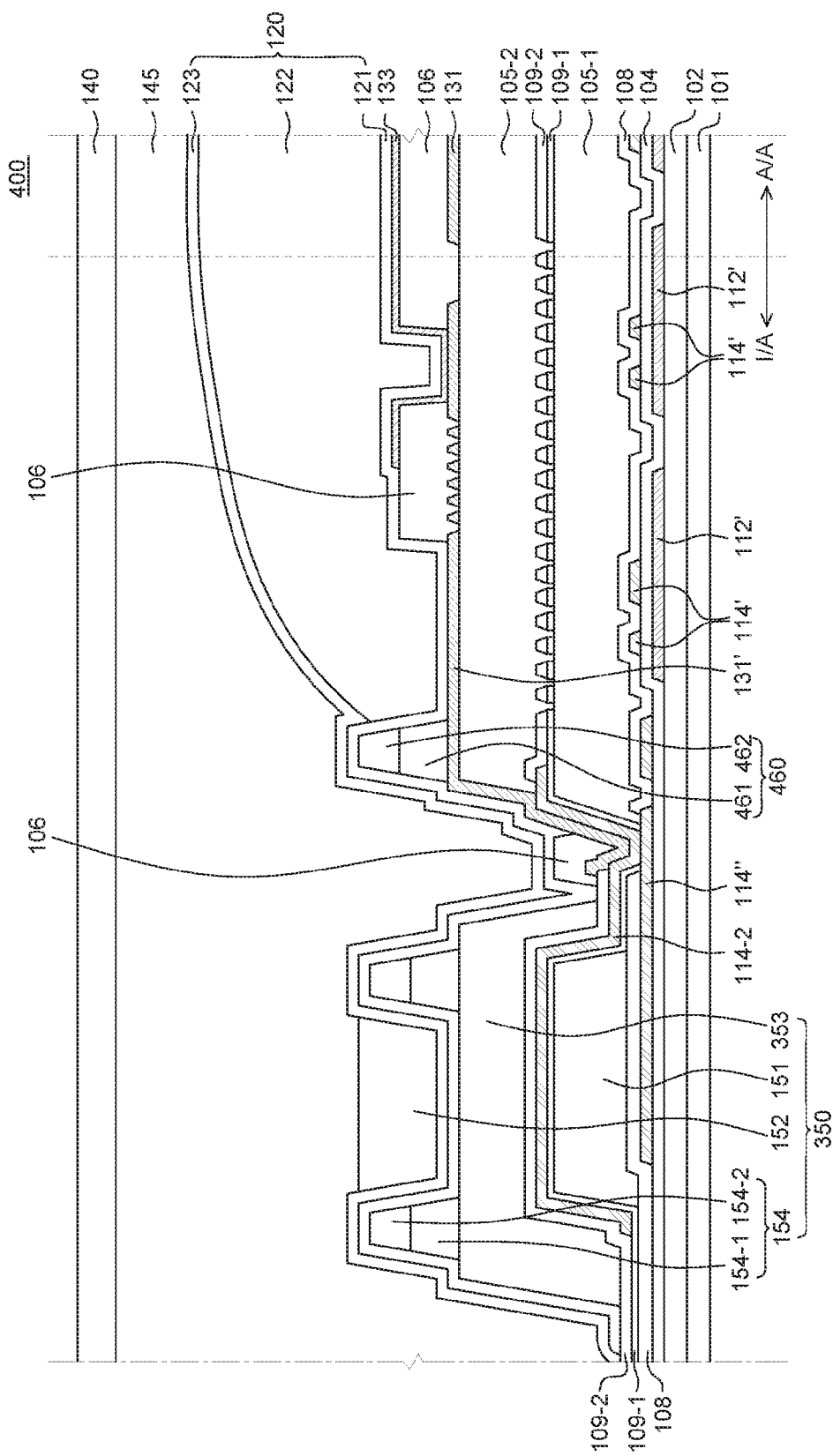

FIG. 8 is a cross-sectional view of a part of an active area and an inactive area of an OLED device according to yet another example embodiment of the present disclosure. An OLED device 400 shown in FIG. 8 is substantially identical to the OLED device 300 shown in FIG. 7 except that the former further comprises a wall 460 on the first planarization layer 105-1 and the second planarization layer 105-2; and, therefore, the redundant description will be omitted.

Referring to FIG. 8, the wall 460 is disposed on the first planarization layer 105-1 and the second planarization layer 105-2. For example, the wall 460 may include a lower layer 461 made of the same material as the bank 106, and an upper layer 462 made of the same material as the spacer 107. As the wall 460 is disposed on the first planarization layer 105-1 and the second planarization layer 105-2, the organic material applied to form the organic layer 122 of the encapsulation element 120 can be limited by the wall 460.

A touch line may be disposed on the structure 350 of the OLED device 400, and touch sensing electrodes may be disposed on the encapsulation element 120 in the active area A/A, as shown in FIGS. 4 and 5.

Figure 9:
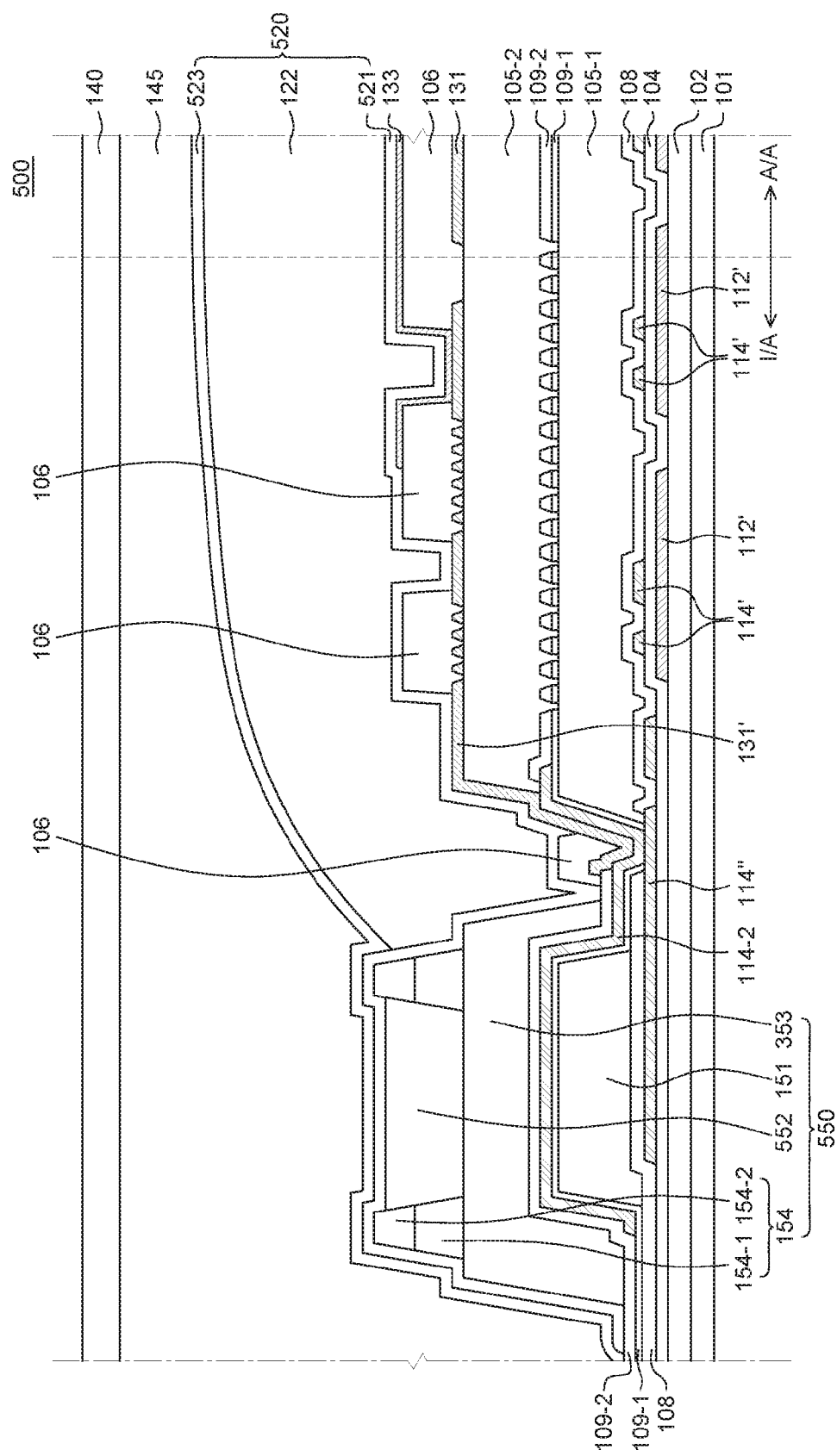

FIG. 9 is a cross-sectional view of a part of an active area and an inactive area of an OLED device according to still another example embodiment of the present disclosure. An OLED device 500 shown in FIG. 9 is substantially identical to the OLED device 400 shown in FIG. 7 except that a structure 550 and an encapsulation element 520 are different; and, therefore, the redundant description will be omitted.

Referring to FIG. 9, a second layer 552 of a structure 550 is disposed directly on a third layer 353 of the structure 550. That is, the second layer 552 may fill the space between the plurality of walls 154 so that it comes in contact with the plurality of walls 154 and the third layer 353 of the structure 550. Accordingly, a first inorganic layer 521 and a second inorganic layer 523 of an encapsulation element 520 may be formed to cover the plurality of walls 154 and the second layer 552. That is, the second layer 552 is disposed between the plurality of walls 154 under the first inorganic layer 521 and the second inorganic layer 523, such that the first inorganic layer 521 and the second inorganic layer 523 completely cover the entirety of the structure 550. Accordingly, the organic material of the structure 550 can be covered with the first inorganic layer 521 and the second inorganic layer 523 without being exposed to the outside.

A touch line may be disposed on the structure 550 of the OLED device 500, and touch sensing electrodes may be disposed on the encapsulation element 520 in the active area A/A, as shown in FIGS. 4 and 5.

In the OLED device 500 according to this example embodiment of the present disclosure, the second layer 552 of the structure 550 comes in contact with the third layer 353. That is, the second layer 552 comes in contact with the top surface of the third layer 353 and the side surfaces of the plurality of walls 154, such that it may fill the space between the plurality of walls 154. As a result, the first inorganic layer 521 and the second inorganic layer 523 of the encapsulation element 520 can completely cover the entirety of the structure 550, such that the organic material of the structure 550 is not exposed to the outside. In this manner, in the OLED device 500 according to this example embodiment of the present disclosure, the overflow of the organic layer 122 of the encapsulation element 520 can be suppressed by using the structure 550. In addition, an even top surface is provided in the inactive area I/A, and the first layer 151, the plurality of walls 154, the second layer 552 and the third layer 353 of the structure 550 can be covered by the first inorganic layer 521 and the second inorganic layer 523 of the encapsulation element 520 disposed in the non-active area I/A, thereby efficiently blocking permeation of the moisture and oxygen.

Figure 10:
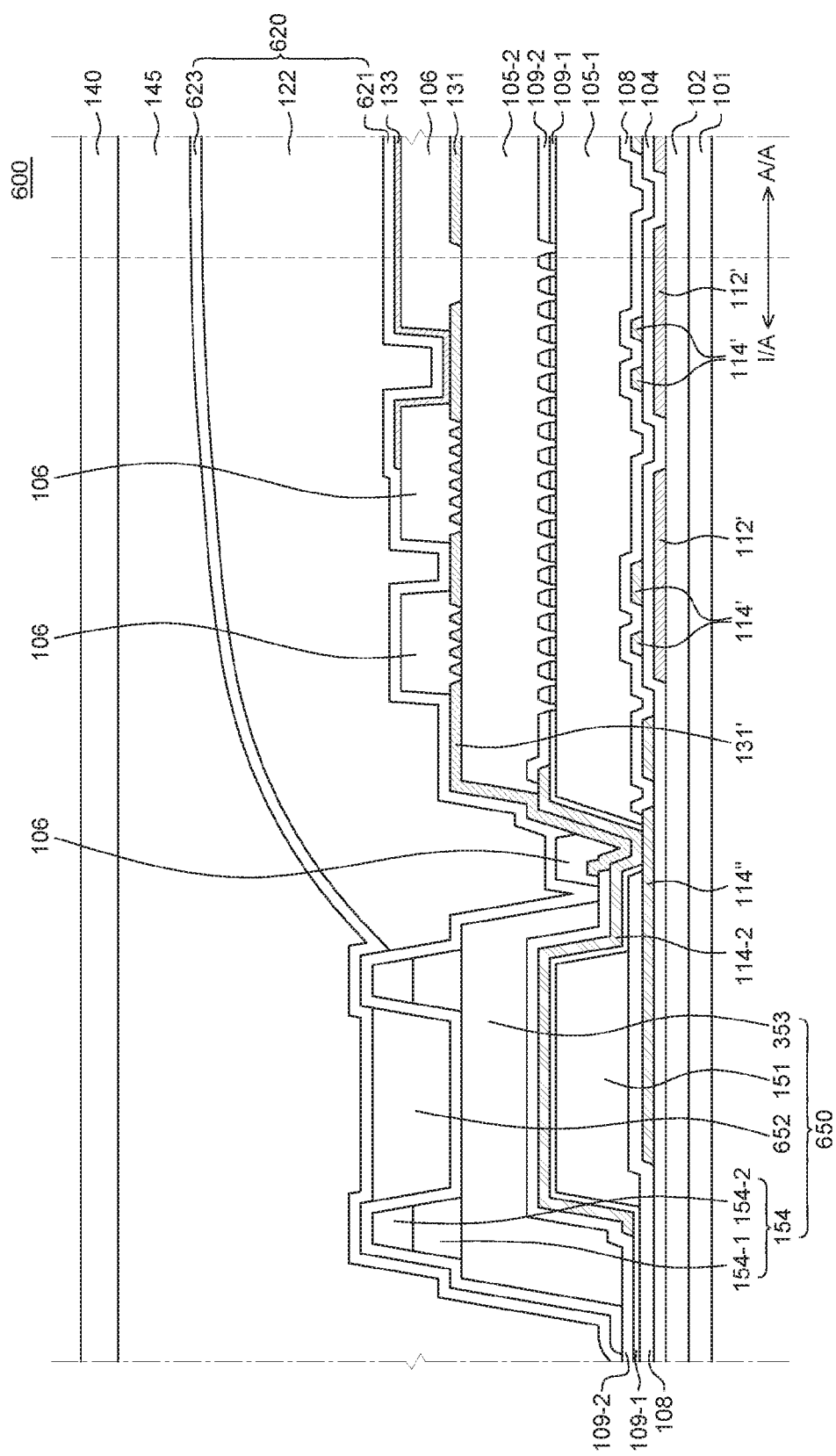

FIG. 10 is a cross-sectional view of a part of an active area and an inactive area of an OLED device according to yet another example embodiment of the present disclosure. An OLED device 600 shown in FIG. 10 is substantially identical to the OLED device 300 shown in FIG. 7 except that a structure 650 and an encapsulation element 620 are different; and, therefore, the redundant description will be omitted.

Referring to FIG. 10, a first inorganic layer 621 of an encapsulation element 620 is disposed so as to surround the third layer 353 of the structure 650 and the plurality of walls 154. That is, the first inorganic layer 621 is disposed so as to surround the top surface and side surfaces of the third layer 353 and the top surfaces and side surfaces of the plurality of walls 154.

A second layer 652 of the structure 650 is disposed to fill the space between the plurality of walls 154. The second layer 652 is formed to fill the space between the plurality of walls 154 covered by the first inorganic layer 621. The second layer 652 is made of the same material as the organic layer 122 of the encapsulation element 620 via the same process. That is, the second layer 652 may be formed by coating the organic material between the plurality of walls 154 during the process of forming the organic layer 122 of the encapsulation element 620 by inkjet coating or the like.

The second inorganic layer 623 of the encapsulation element 620 is disposed on the structure 650. That is, the second inorganic layer 623 may be formed to cover the plurality of walls 154 and the second layer 652, such that the entirety of the structure 650 is completely covered. Accordingly, the organic material of the structure 650 can be covered with the second inorganic layer 623 without being exposed to the outside.

A touch line may be disposed on the structure 650 of the OLED device 600, and touch sensing electrodes may be disposed on the encapsulation element 620 in the active area A/A, as shown in FIGS. 4 and 5.

In the OLED device 600 according to this example embodiment of the present disclosure, the second inorganic layer 623 of the encapsulation element 620 may completely cover the entirety of the structure 650, such that the organic material of the structure 650 is not exposed to the outside. As a result, in the OLED display 600 according to this example embodiment of the present disclosure, the overflow of the organic layer 122 of the encapsulation element 620 is suppressed by using the structure 650, and an even top surface is provided in the inactive area I/A. In addition, the second inorganic layer 623 of the encapsulation element 620 disposed in the inactive area I/A covers the first layer 151, the plurality of walls 154, the second layer 652 and the third layer 353 of the structure 650, so that permeation of moisture and oxygen can be blocked more efficiently.

Further, in the OLED device 600 according to this example embodiment of the present disclosure, the second layer 652 of the structure 650 may be formed together with the organic layer 122 of the encapsulation element 620. That is, during the process of fabricating the organic layer 122 of the encapsulation element 620, the organic layer 122 of the encapsulation element 620 may be disposed also between the plurality of walls 154 of the structure 650, such that the organic layer 122 of the encapsulation element 620 and the second layer 652 of the structure 650 can be formed simultaneously. Accordingly, the process of forming the structure 650 in the OLED device 600 can be simplified.

Figure 11:
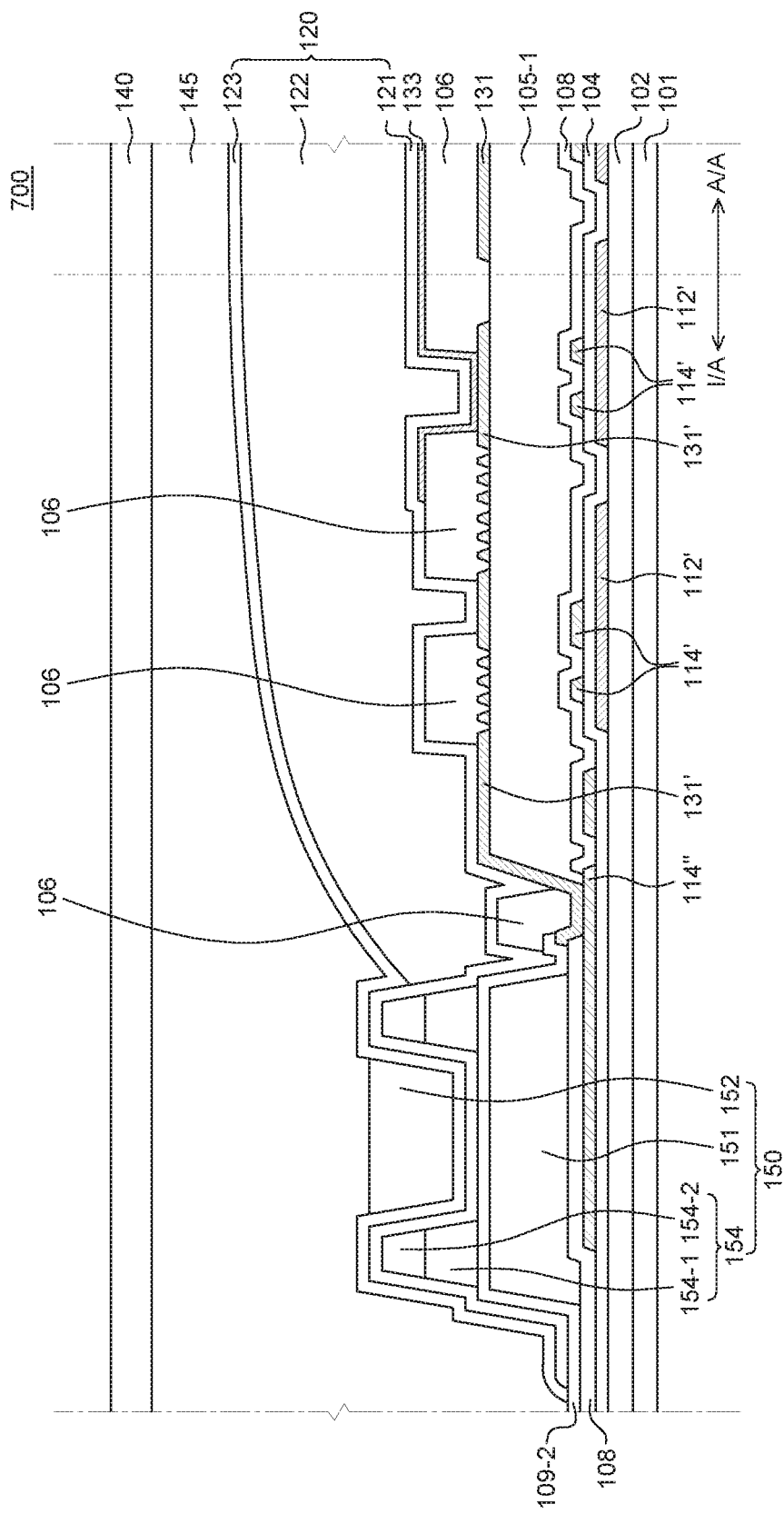

FIG. 11 is a cross-sectional view of a part of an active area and an inactive area of an OLED device according to still another example embodiment of the present disclosure. An OLED device 700 shown in FIG. 11 is substantially identical to the OLED device 100 shown in FIGS. 1 to 3 except that the second planarization layer 105-2 and accordingly some components are eliminated; and, therefore, the redundant description will be omitted.

As described above, as the OLED devices are developed to support higher resolution, the numbers of various lines and elements are increased, and thus the space in which various lines and elements can be disposed can be increased by using the two planarization layers. However, the number of the planarization layers is not necessarily limited to two, and may vary depending on the design of the OLED device.

Referring to FIG. 11, in the OLED device 700 according to this example embodiment of the present disclosure, only a first planarization layer 105-1 is disposed in the active area A/A and the inactive area I/A. Although the OLED device 700 includes only one planarization layer 105-1, the structure 150 may include a first layer 151 made of the same material as the first planarization layer 105-1, a plurality of walls 154 on the first layer 151, and a second layer 152 that is used to fill the space between the of walls 154. Accordingly, in the OLED device 700 according to this example embodiment of the present disclosure, the overflow of the organic layer 122 of the encapsulation element 120 can be controlled, and an area with an even surface can be provided where a conductive layer such as the touch line 262 may be disposed.

A touch line may be disposed on the structure 150 of the OLED device 700, and touch sensing electrodes may be disposed on the encapsulation element 120 in the active area A/A, as shown in FIGS. 4 and 5.

The example embodiments of the present disclosure can also be described as follows:

According to an aspect of the present disclosure, an OLED device includes: a substrate having an active area and an inactive area surrounding the active area; a first planarization layer flattening a surface on circuit elements in the active area and inactive area; an organic light-emitting element on the first planarization layer; an encapsulation element on the organic light-emitting element and the first planarization layer, the encapsulation element having a first inorganic layer, a second inorganic layer and an organic layer between the first and second inorganic layers; and a structure in the inactive area and spaced apart from the first planarization layer. The structure includes a first layer made of a same material as the first planarization layer; a plurality of walls on the first layer and spaced apart from each other; and a second layer that fills a space between the plurality of walls.

The first and second inorganic layers may cover the first layer and the plurality of walls.

The second layer may be disposed on the first and second inorganic layers and between the plurality of walls.

The second layer may be disposed between the first and second inorganic layers and between the plurality of walls.

The second layer may be disposed under the first and second inorganic layers and between the plurality of walls.

The top surface of the second inorganic layer disposed on the plurality of walls may be higher than the top surface of the second layer.

The second layer may be made of a same material as the organic layer.

The OLED device may further include: a second planarization layer disposed on or under the first planarization layer.

The structure may further include a third layer disposed under the first layer or between the first layer and the plurality of walls and made of a same material as the second planarization layer.

A layer disposed on the first and third layers may cover a top surface and side surfaces of a layer disposed thereunder.

The OLED device may further include: a wall disposed on the first planarization layer and the second planarization layer, wherein the organic layer is disposed on an inner side of the wall.

The plurality of walls may be made of a same material as at least one insulating pattern disposed on the first planarization layer in the active area.

The OLED device may further include: a bank disposed on the first planarization layer and covering a part of an anode of the organic light-emitting element; and a spacer disposed on the bank. Each of the plurality of walls may include a lower layer made of a same material as the bank, and an upper layer made of a same material as the spacer.

The OLED device may further include: a conductive layer on the structure.

The OLED device may further include: a plurality of touch sensing electrodes on the encapsulation element, and the conductive layer may be a touch line connected to the plurality of touch sensing electrodes.

According to another aspect of the present disclosure, an OLED device includes: a substrate on which an active area and an inactive area surrounding the active area are defined; at least one planarization layer disposed in the active area; an organic light-emitting element disposed on the at least one planarization layer; an encapsulation element covering the organic light-emitting element and comprising an organic layer; and a structure configured to suppress overflow of the organic layer and provide an even top surface.

The structure may further include at least one subsidiary layer made of a same material as the at least one planarization layer; a plurality of walls disposed on the subsidiary layer; and a filling layer disposed in a space between the plurality of walls to provide an even top surface.

The OLED device may further include: a conductive layer disposed on the structure to be electrically connected to a conductive pattern on the encapsulation element.

Thus far, example embodiments of the present disclosure have been described in detail with reference to the accompanying drawings. However, the present disclosure is not limited to the example embodiments, and modifications and variations can be made thereto without departing from the technical idea of the present disclosure. Accordingly, the example embodiments described herein are merely illustrative and are not intended to limit the scope of the present disclosure. The technical idea of the present disclosure is not limited by the example embodiments. The scope of protection sought by the present disclosure is defined by the appended claims and all equivalents thereof are construed to be within the true scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light-emitting display (OLED) device comprising:
 a substrate having an active area and an inactive area surrounding the active area;

a first planarization layer that provides an upper flattened surface on elements in the active area and the inactive area, the first planarization layer having an active area portion and an inactive area portion;

an organic light-emitting element on the first planarization layer in the active area;

an encapsulation element on the organic light-emitting element and the first planarization layer, the encapsulation element having a first inorganic layer, a second inorganic layer and an organic layer between the first and second inorganic layers; and a structure in the inactive area that is spaced apart from the first planarization layer portion located in the active area, wherein the structure in the inactive area comprises, a first layer member that includes the inactive area portion of the first planarization layer that is spaced apart from the first planarization layer portion located in the active area;

a plurality of walls overlying the first layer member that are spaced apart from each other; and a second layer being disposed between the plurality of walls, wherein the second layer is spaced apart from the organic layer of the encapsulation element.

2. The OLED device of claim 1, wherein the first and second inorganic layers cover the first layer member and the plurality of walls.

3. The OLED device of claim 2, wherein the second layer is disposed on the first and second inorganic layers.

4. The OLED device of claim 2, wherein the second layer is disposed between the first and second inorganic layers.

5. The OLED device of claim 2, wherein the second layer is disposed under the first and second inorganic layers.

6. The OLED device of claim 2, wherein a top surface of the second inorganic layer disposed on the plurality of walls is higher than a top surface of the second layer.

7. The OLED device of claim 1, wherein the second layer is made of a same material as the organic layer.

8. The OLED device of claim 1, further comprising:
a second planarization layer disposed on or under the first planarization layer.

9. The OLED device of claim 8, wherein the structure further comprises a third layer disposed between the first layer member and the plurality of walls.

10. The OLED device of claim 8, wherein the structure is made of a same material as the second planarization layer.

11. The OLED device of claim 9, wherein a layer disposed on the first and third layers covers a top surface and side surfaces of a layer disposed thereunder.

12. The OLED device of claim 9, further comprising:
a wall disposed on the first planarization layer and the second planarization layer,
wherein the organic layer is disposed on an inner side of the wall.

13. The OLED device of claim 1, wherein the plurality of walls is made of a same material as at least one insulating pattern disposed on the first planarization layer in the active area.

14. The OLED device of claim 10, further comprising:
a bank disposed on the first planarization layer and covering a part of an anode of the organic light-emitting element; and
a spacer disposed on the bank, wherein each of the plurality of walls comprises a lower layer made of a same material as the bank, and an upper layer made of a same material as the spacer.

15. The OLED device of claim 1, further comprising:
a conductive layer on the structure; and
a plurality of touch sensing electrodes on the encapsulation element,
wherein the conductive layer is a touch line connected to the plurality of touch sensing electrodes.

16. An organic light-emitting display (OLED) device comprising:
a substrate on which an active area and an inactive area surrounding the active area are defined;
a first planarization layer having a first portion disposed in the active area and a second portion disposed in the inactive area, the second portion disposed in the inactive area being spaced from the portion disposed in the active area;
a second planarization layer overlying the first planarization layer, the second planarization layer having a portion disposed in the active area;
an organic light-emitting element disposed on the at least one planarization layer;
a bank layer having a first portion disposed in the active area and second and third portions disposed in the inactive area, the second and third portions disposed in the inactive area being disposed overlying the second portion of the planarization layer disposed in the inactive area and being spaced apart from each other;
a spacer layer having a first portion disposed in the active area and second and third portions disposed in the inactive area, the second and third portions disposed in the inactive area being disposed overlying the second and third portions of the bank layer disposed on the planarization layer and being spaced apart from each other;
an encapsulation element that includes an organic layer, the encapsulation element covering the organic light-emitting element; and
a space located between the first portion of the first planarization layer in the active area and the first planarization layer in the inactive area that has a depth equal to or greater than the sum of the first planarization layer and the second planarization layer on a first side and the sum of the first planarization layer, the bank layer and the spacer layer on a second side to provide a space to receive any overflow of the organic layer.

17. The OLED device of claim 16, further comprising:
a filling layer disposed in a space between the second and third portions of the bank layer and the second and third portions of the spacer layer, and the filling layer provides an even top surface between the second and third portions of the spacer layer.

18. The OLED device of claim 17, further comprising:
a conductive layer disposed on the filling layer and the second and third portions of the spacer layer to be electrically connected to a conductive pattern on the encapsulation element.

19. The OLED device of claim 16, further comprising:
a leveling layer positioned between the two spacer layer portions disposed in the inactive area that provides an even top surface between the two spacer layer portions.

* * * * *